United States Patent
Sasaki

(10) Patent No.: US 7,071,600 B2
(45) Date of Patent: Jul. 4, 2006

(54) STACK-TYPE PIEZOELECTRIC DEVICE

(75) Inventor: Satoshi Sasaki, Akita (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/999,013

(22) Filed: Nov. 30, 2004

(65) Prior Publication Data

US 2005/0156488 A1    Jul. 21, 2005

(30) Foreign Application Priority Data

Dec. 1, 2003 (JP) ............................ P2003-402114

(51) Int. Cl.
*H01L 41/083* (2006.01)
*H01L 41/047* (2006.01)

(52) U.S. Cl. ..................................... 310/366

(58) Field of Classification Search ................ 310/365, 310/366, 328
See application file for complete search history.

(56) References Cited

U.S. PATENT DOCUMENTS 6,800,988 B1 * 10/2004 Ribak ......................... 310/365

FOREIGN PATENT DOCUMENTS

| JP | A 2001-260340 | 9/2001 |
|----|----------------|--------|
| JP | A 2002-019102 | 1/2002 |
| JP | A 2002-254634 | 9/2002 |
| JP | A-2002-254634 | * 9/2002 |

* cited by examiner

*Primary Examiner*—Thomas M. Dougherty
(74) *Attorney, Agent, or Firm*—Oliff & Berridge, PLC

(57) ABSTRACT

Provided is a stack-type piezoelectric device capable of preventing cracks from being made in a portion between adjacent individual electrodes and a relay common electrode in a piezoelectric layer with individual electrodes formed therein, because of a polarization process or the like.

In a stack-type piezoelectric device 1, each piezoelectric layer 3 with individual electrodes 2 formed therein also has relay common electrodes 6 formed so as to be electrically connected to each of common electrodes 4, 4 adjacent in a stack direction. For this reason, for example, where a voltage is applied between individual electrodes 2 and common electrodes 4 to effect a polarization process, electric fields are generated not only in the thickness direction of the piezoelectric layer 3, but also between adjacent individual electrodes 2 and relay common electrode 6. At this time, since an end 2$b$ of each individual electrode 2 adjacent to the relay common electrode 6 has a semicircular contour on the relay common electrode 6 side, it is feasible to prevent cracks from being made in a portion between adjacent individual electrodes 2 and relay common electrode 6 in the piezoelectric layer 3.

6 Claims, 8 Drawing Sheets

Fig.7
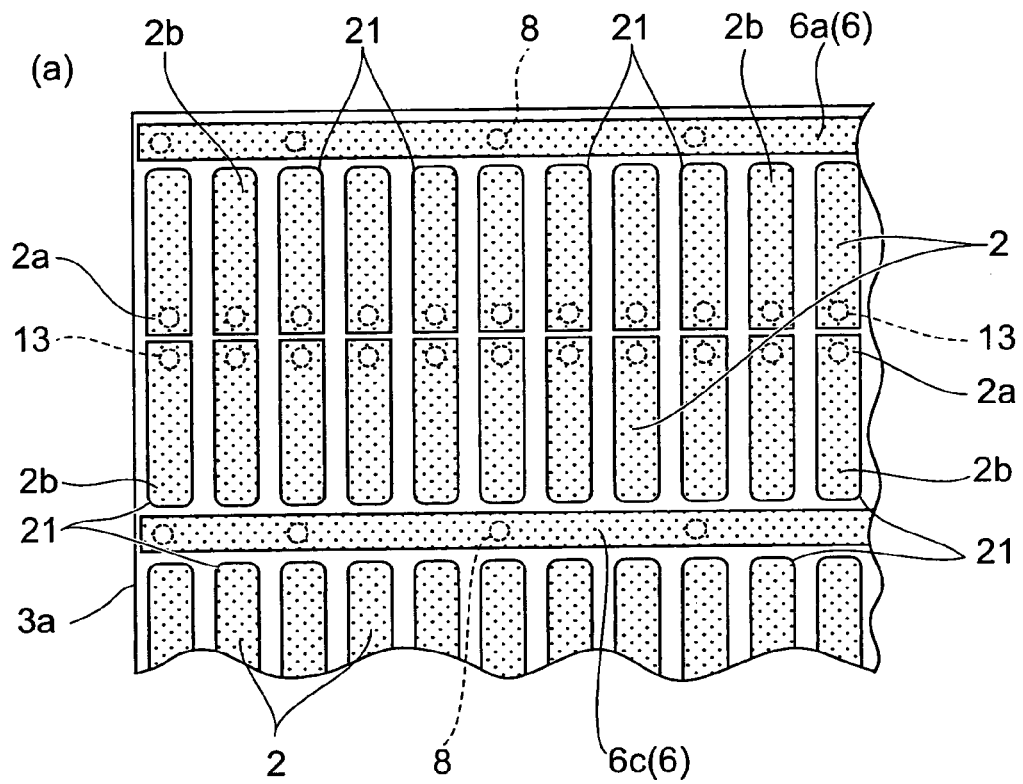
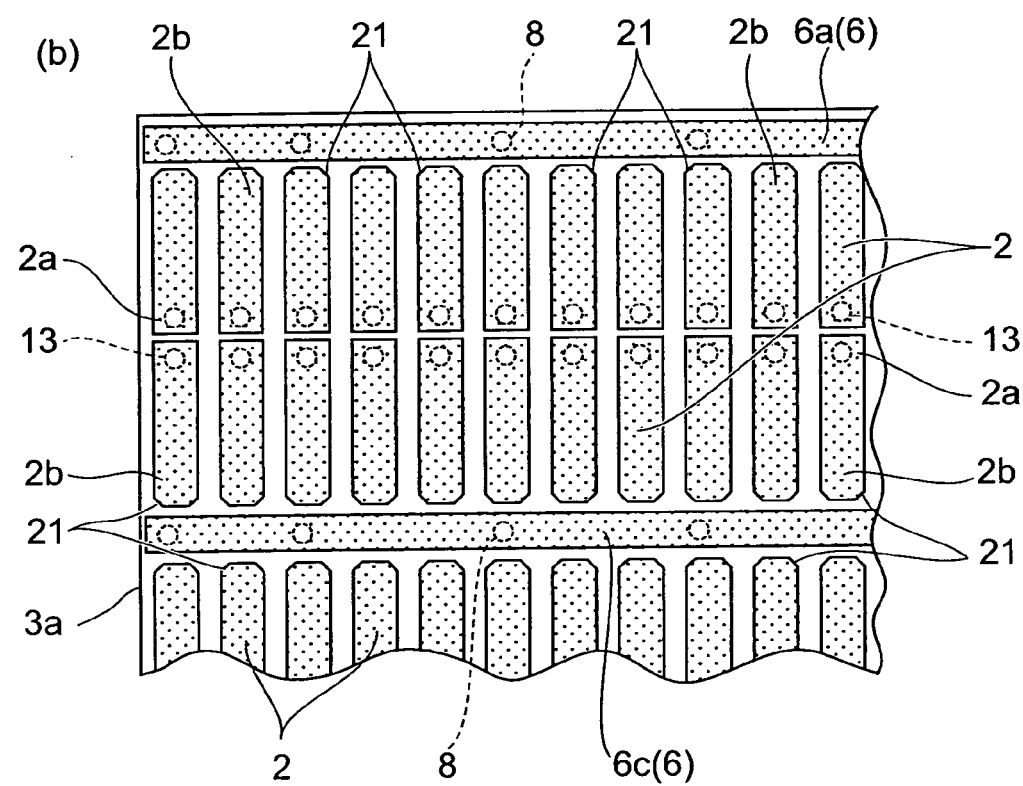

Fig.8
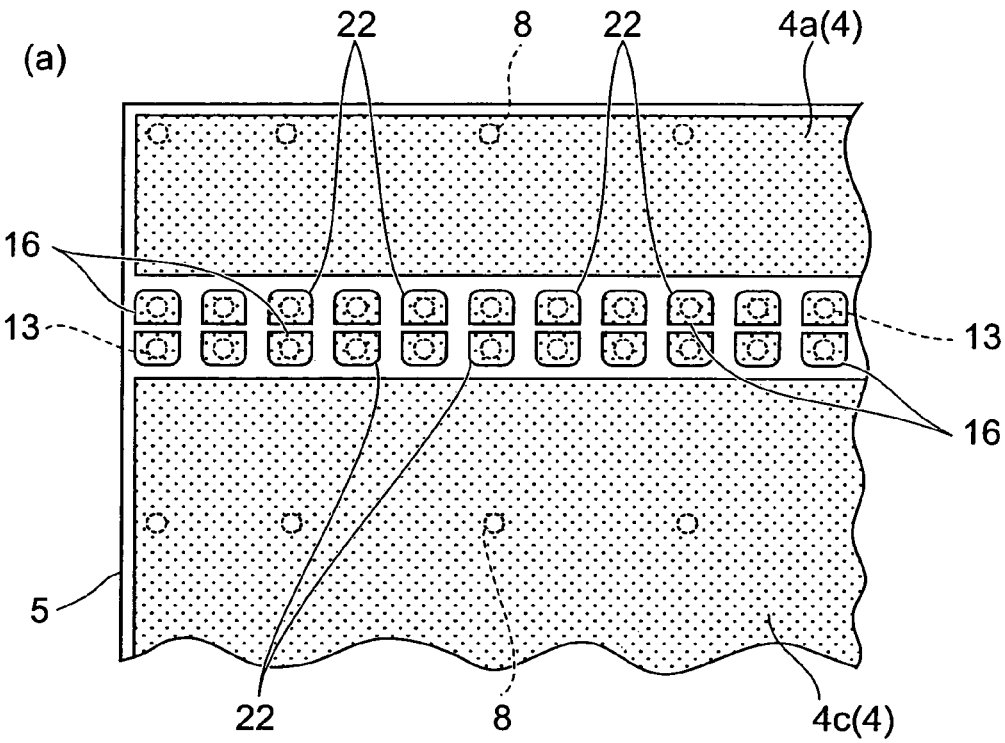
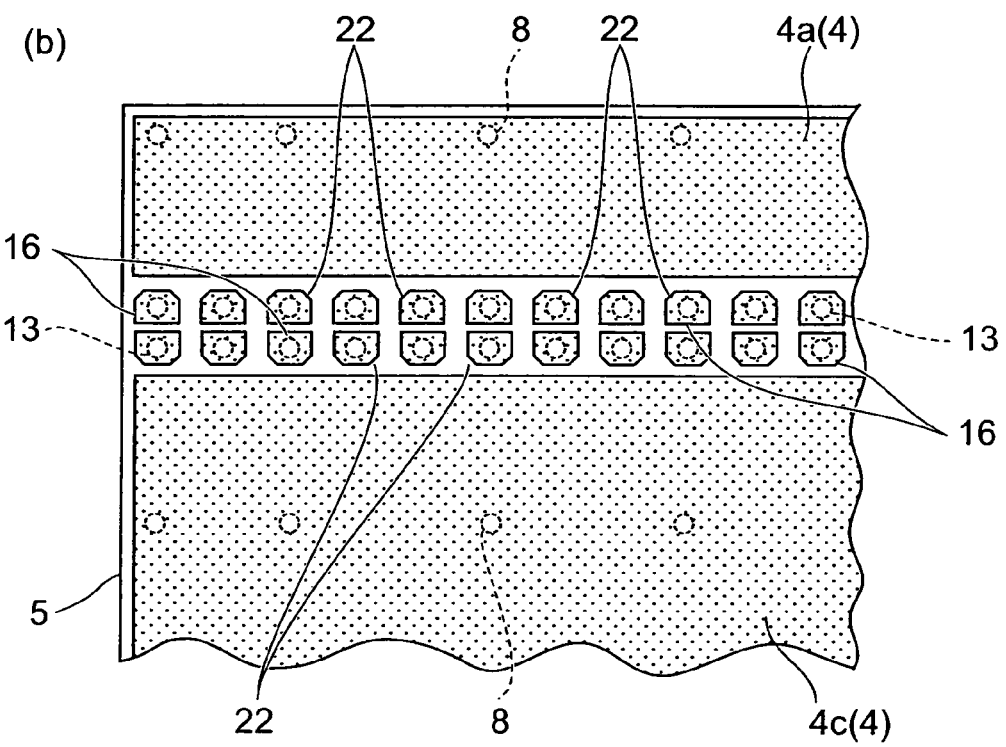

STACK-TYPE PIEZOELECTRIC DEVICE

BACKGROUND OF THE INVENTION

1. Field of the Invention

The present invention relates to a stack-type piezoelectric device used as a drive source for small displacement, such as control of a valve of a micropump.

2. Related Background Art

An example of the conventional stack-type piezoelectric devices is the one described in Japanese Patent Application Laid-Open No. 2002-254634. This stack-type piezoelectric device consists of an alternate stack of piezoelectric layers in each of which a number of individual electrodes are formed in a pattern, and piezoelectric layers in each of which a common electrode is formed in a pattern, and the individual electrodes aligned in the thickness direction of the stack-type piezoelectric device are connected by electroconductive members through through holes formed in the piezoelectric layers. In this stack-type piezoelectric device, when a voltage is applied between predetermined individual electrodes and common electrodes, active parts (portions to be distorted by piezoelectric effect) corresponding to the predetermined individual electrodes in the piezoelectric layers are selectively displaced.

SUMMARY OF THE INVENTION

However, the above-stated stack-type piezoelectric device has the following problem. Namely, each piezoelectric layer with individual electrodes formed in a pattern therein also has relay common electrodes formed in a pattern, in order to electrically connect each common electrode aligned in the thickness direction of the stack-type piezoelectric device. For this reason, when a polarization process is carried out by applying a voltage between the individual electrodes and the common electrodes in production of the stack-type piezoelectric device, electric fields are generated not only in the thickness direction of the piezoelectric layers, but also between adjacent individual electrodes and relay common electrode in the piezoelectric layers with the individual electrodes formed in a pattern. Therefore, distortion in the in-plane directions can produce cracks from the corners of the individual electrodes toward the relay common electrodes in the portion between adjacent individual electrodes and relay common electrode in the piezoelectric layers.

The production of such cracks becomes more prominent with decrease in the space between the individual electrodes and the relay common electrodes, in order to achieve miniaturization of the stack-type piezoelectric device or high integration of the individual electrodes, while maintaining the area of active parts contributing to vibration in the piezoelectric layers.

The present invention has been accomplished in view of such circumstances, and an object of the present invention is therefore to provide a stack-type piezoelectric device capable of preventing cracks from being made in the portion between the adjacent individual electrodes and relay common electrode in the piezoelectric layers with the individual electrodes formed therein, because of the polarization process or the like in production of the stack-type piezoelectric device.

In order to achieve the above object, a stack-type piezoelectric device according to the present invention is a stack-type piezoelectric device comprising an alternate stack of first piezoelectric layers in each of which a plurality of individual electrodes electrically independent of each other are formed, and second piezoelectric layers in each of which a common electrode adapted for application of a voltage between the common electrode and the individual electrodes is formed, wherein each of the first piezoelectric layers comprises a relay common electrode formed so as to be electrically connected to each of the common electrodes adjacent in a stack direction, by an electroconductive member in a through hole formed in the first piezoelectric layer and by an electroconductive member in a through hole formed in the second piezoelectric layer, and wherein an end on the relay common electrode side, of each individual electrode adjacent to the relay common electrode has a convexly curved contour.

In this stack-type piezoelectric device, each first piezoelectric layer with the individual electrodes formed therein also comprises the relay common electrode formed so as to be electrically connected to each of the common electrodes adjacent in the stack direction. For this reason, for example, where the polarization process is carried out by applying a voltage between the individual electrodes and the common electrodes in production of the stack-type piezoelectric device, electric fields are generated not only in the thickness direction of the first piezoelectric layer, but also between adjacent individual electrodes and relay common electrode in the first piezoelectric layer. At this time, since the end on the relay common electrode side, of each individual electrode adjacent to the relay common electrode has the convexly curved contour, it is feasible to prevent cracks from being made in a portion between the adjacent individual electrodes and relay common electrode in the first piezoelectric layer.

Another stack-type piezoelectric device according to the present invention is a stack-type piezoelectric device comprising an alternate stack of first piezoelectric layers in each of which a plurality of individual electrodes electrically independent of each other are formed, and second piezoelectric layers in each of which a common electrode adapted for application of a voltage between the common electrode and the individual electrodes is formed, wherein each of the first piezoelectric layers comprises a relay common electrode formed so as to be electrically connected to each of the common electrodes adjacent in a stack direction, by an electroconductive member in a through hole formed in the first piezoelectric layer and by an electroconductive member in a through hole formed in the second piezoelectric layer, and wherein corners in an end on the relay common electrode side, of each individual electrode adjacent to the relay common electrode are chamfered.

In this stack-type piezoelectric device, just as in the aforementioned stack-type piezoelectric device, for example, when the polarization process is carried out by applying a voltage between the individual electrodes and the common electrodes in production of the stack-type piezoelectric device, electric fields are similarly generated not only in the thickness direction of the first piezoelectric layer, but also between adjacent individual electrodes and relay common electrodes in the first piezoelectric layer. At this time, since the corners in the end on the relay common electrode side, of each individual electrode adjacent to the relay common electrode are chamfered, it is feasible to prevent cracks from being made in a portion between the adjacent individual electrodes and relay common electrode in the first piezoelectric layer.

The stack-type piezoelectric devices may have a configuration wherein each of the second piezoelectric layers comprises a relay individual electrode formed so as to be electrically connected to each of the individual electrodes adjacent in the stack direction, by an electroconductive member in a through hole formed in the first piezoelectric layer and by an electroconductive member in a through hole formed in the second piezoelectric layer, and wherein an end on the common electrode side, of each relay individual electrode adjacent to the common electrode has a convexly curved contour.

In the case where the second piezoelectric layer with the common electrode formed therein also comprises the relay individual electrode formed so as to be electrically connected to each of the individual electrodes adjacent in the stack direction, for example, when the polarization process is carried out by applying a voltage between the individual electrodes and the common electrodes in production of the stack-type piezoelectric device, electric fields are generated not only in the thickness direction of the second piezoelectric layer, but also between adjacent relay individual electrodes and common electrode in the second piezoelectric layer. At this time, since the end on the common electrode side, of each relay individual electrode adjacent to the common electrode has the convexly curved contour, it is feasible to prevent cracks from being made in a portion between the adjacent relay individual electrodes and common electrode in the second piezoelectric layer.

The stack-type piezoelectric devices may also have a configuration wherein each of the second piezoelectric layers comprises a relay individual electrode formed so as to be electrically connected to each of the individual electrodes adjacent in the stack direction, by an electroconductive member in a through hole formed in the first piezoelectric layer and by an electroconductive member in a through hole formed in the second piezoelectric layer, and wherein corners in an end on the common electrode side, of each relay individual electrode adjacent to the common electrode are chamfered.

In this case, just as in the above-mentioned case, for example, when the polarization process is carried out by applying a voltage between the individual electrodes and the common electrodes in production of the stack-type piezoelectric device, electric fields are generated not only in the thickness direction of the second piezoelectric layer, but also between adjacent relay individual electrodes and common electrode in the second piezoelectric layer. At this time, since the corners in the end on the common electrode side, of each relay individual electrode adjacent to the common electrode are chamfered, it is feasible to prevent cracks from being made in a portion between the adjacent relay individual electrodes and common electrode in the second piezoelectric layer.

BRIEF DESCRIPTION OF THE DRAWINGS

FIG. 7 is enlarged plan views showing modification examples of the individual electrodes in the stack-type piezoelectric device shown in FIG. 1, wherein (a) is a case where the corners of the individual electrodes are roundly chamfered, and (b) a case where the corners of the individual electrodes are linearly chamfered.

FIG. 8 is enlarged plan views showing modification examples of the relay individual electrodes in the stack-type piezoelectric device shown in FIG. 1, wherein (a) is a case where the corners of the relay individual electrodes are roundly chamfered, and (b) a case where the corners of the relay individual electrodes are linearly chamfered.

DESCRIPTION OF THE PREFERRED EMBODIMENTS

Preferred embodiments of the stack-type piezoelectric devices according to the present invention will be described below in detail with reference to the drawings.

Figure 1:
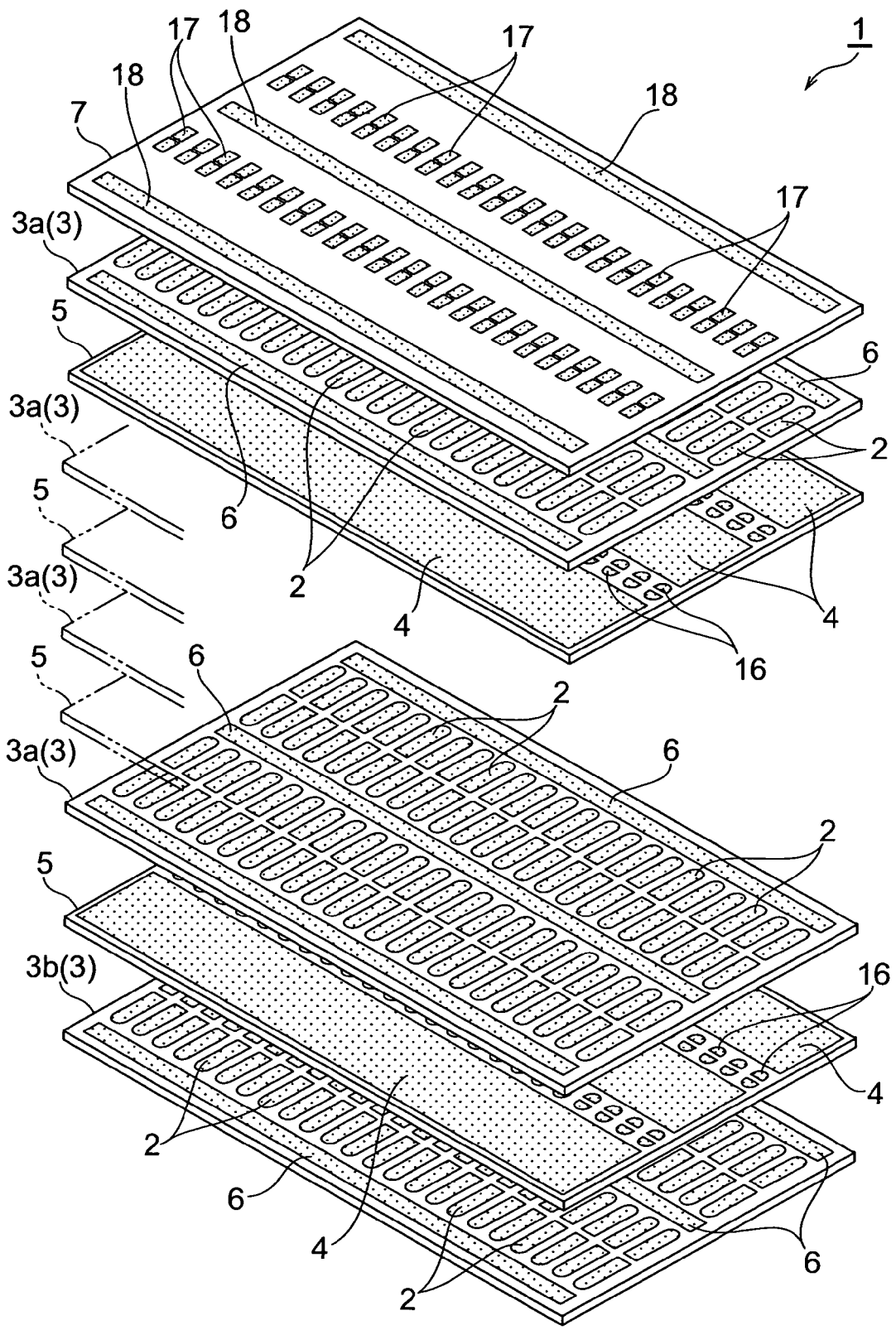
FIG. 1 is an exploded perspective view showing an embodiment of the stack-type piezoelectric device according to the present invention.

As shown in FIG. 1, a stack-type piezoelectric device 1 is comprised of an alternate stack of piezoelectric layers (first piezoelectric layers) 3 in each of which individual electrodes 2 are formed, and piezoelectric layers (second piezoelectric layers) 5 in each of which common electrodes 4 are formed; and a piezoelectric layer 7 in which terminal electrodes 17, 18 are formed, as an uppermost layer laid on the stack.

Each piezoelectric layer 3, 5, 7 consists primarily of a ceramic material such as lead zirconate titanate and is formed, for example, in a rectangular thin plate shape of "10 mm×30 mm and 30 μm thick." The individual electrodes 2 and common electrodes 4 are made of a material consisting primarily of silver and palladium, and are formed in a pattern by screen printing. This also applies similarly to each of electrodes described below, except for the terminal electrodes 17, 18.

Figure 2:
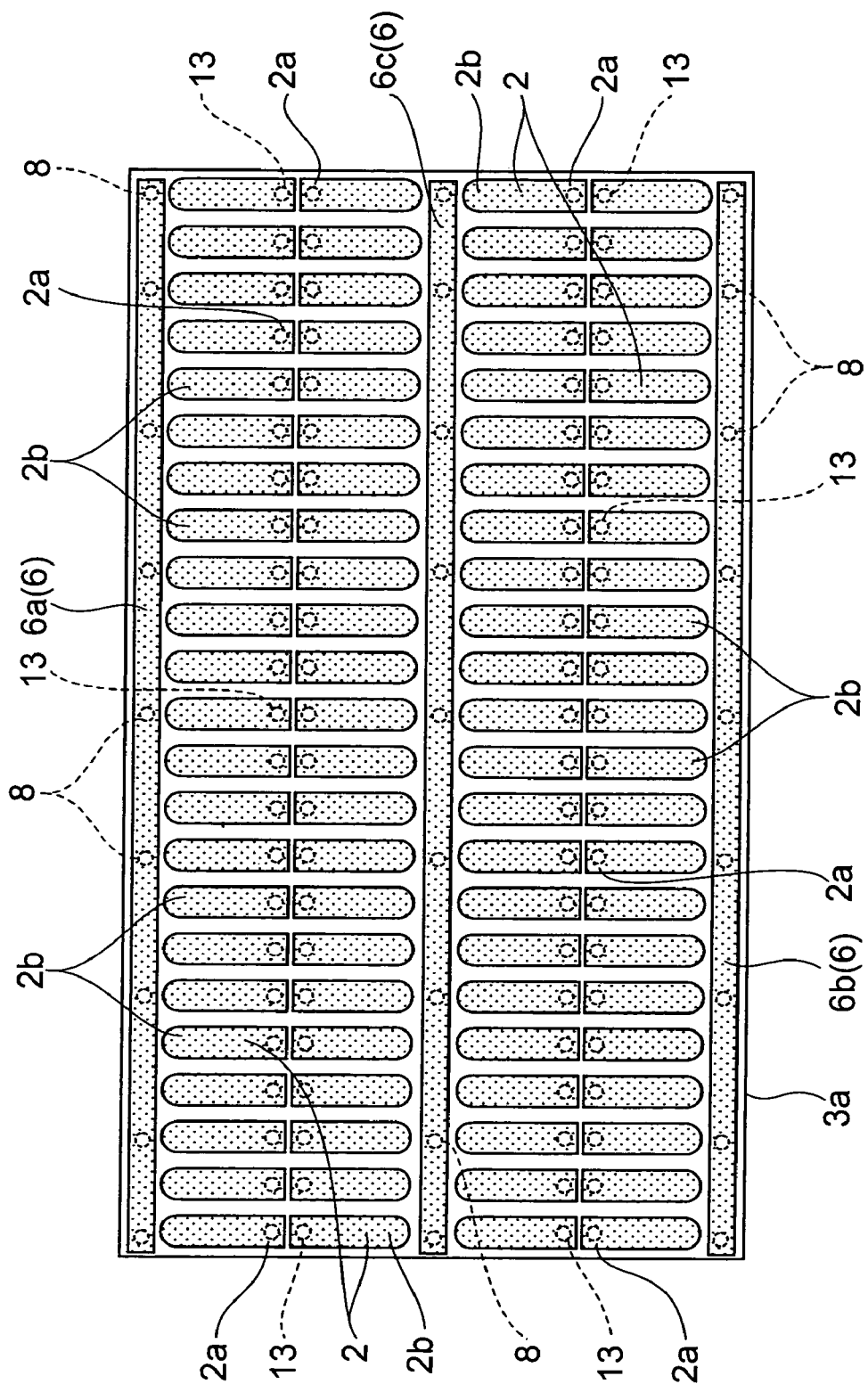
FIG. 2 is a plan view of the second, fourth, sixth, and eighth piezoelectric layers in the stack-type piezoelectric device shown in FIG. 1.

In this stack-type piezoelectric device 1, a number of long individual electrodes 2 are arranged in a matrix, as shown in FIG. 2, on the upper surfaces of the second, fourth, sixth, and eighth piezoelectric layers 3a as counted from the uppermost piezoelectric layer 7. Each individual electrode 2 is placed so that the longitudinal direction thereof is perpendicular to the longitudinal direction of the piezoelectric layer 3a, and adjacent individual electrodes 2, 2 are placed with a predetermined space to achieve electrical independence of each other and to prevent interference between each other's vibrations.

Let the longitudinal direction of the piezoelectric layers 3a be a row direction and the direction perpendicular to the longitudinal direction be a column direction. Then the individual electrodes 2 are arranged, for example, in a matrix of four rows and seventy five columns (the drawing shows a matrix of four rows and twenty three columns for clarity). This matrix arrangement of many individual electrodes 2 enables efficient arrangement for the piezoelectric layers 3a, and it is thus feasible to achieve miniaturization of the stack-type piezoelectric device 1 or high integration of individual electrodes 2, while maintaining the area of active parts contributing to vibration in the piezoelectric layers 3a.

The individual electrodes 2 in the first row and in the second row have their respective ends opposed between the first row and the second row, as connection ends 2a, and are connected to corresponding electroconductive members in through holes 13 formed immediately below the connection ends 2a in the piezoelectric layer 3a. Similarly, the individual electrodes 2 in the third row and in the fourth row have their respective ends opposed between the third row and the fourth row, as connection ends 2a, and are connected to corresponding electroconductive members in through holes 13 formed immediately below the connection ends 2a in the piezoelectric layer 3a.

A relay common electrode 6a of rectangular shape extending along the ends 2b of individual electrodes 2 arrayed in the first row is formed outside the individual electrodes 2 in the first row on the upper surface of each piezoelectric layer 3a and, similarly, a relay common electrode 6b of rectangular shape extending along the ends 2b of individual electrodes 2 arrayed in the fourth row is formed outside the individual electrodes 2 in the fourth row on the upper surface of the piezoelectric layer 3a. Furthermore, a relay common electrode 6c of rectangular shape extending along the ends 2b of individual electrodes 2 arrayed in the second row and in the third row is formed between the individual electrodes 2 in the second row and the individual electrodes 2 in the third row on the upper surface of the piezoelectric layer 3a.

Each relay common electrode 6 is connected to electroconductive members in a plurality of through holes 8 formed immediately below the relay common electrode 6 in the piezoelectric layer 3a. The plurality of through holes 8 formed immediately below each relay common electrode 6 in the piezoelectric layer 3a are formed at predetermined intervals along the extending direction of the relay common electrode 6, for example, one per two or three individual electrodes 2.

In the piezoelectric layer 3a described above, the end 2b on the relay common electrode 6a side, of each individual electrode 2 in the first row adjacent to the relay common electrode 6a has a semicircular contour and, similarly, the end 2b on the relay common electrode 6b side, of each individual electrode 2 in the fourth row adjacent to the relay common electrode 6b also has a semicircular contour. Furthermore, the end 2b on the relay common electrode 6c side, of each individual electrode 2 in the second row and in the third row adjacent to the relay common electrode 6c also has a semicircular contour.

Figure 3:
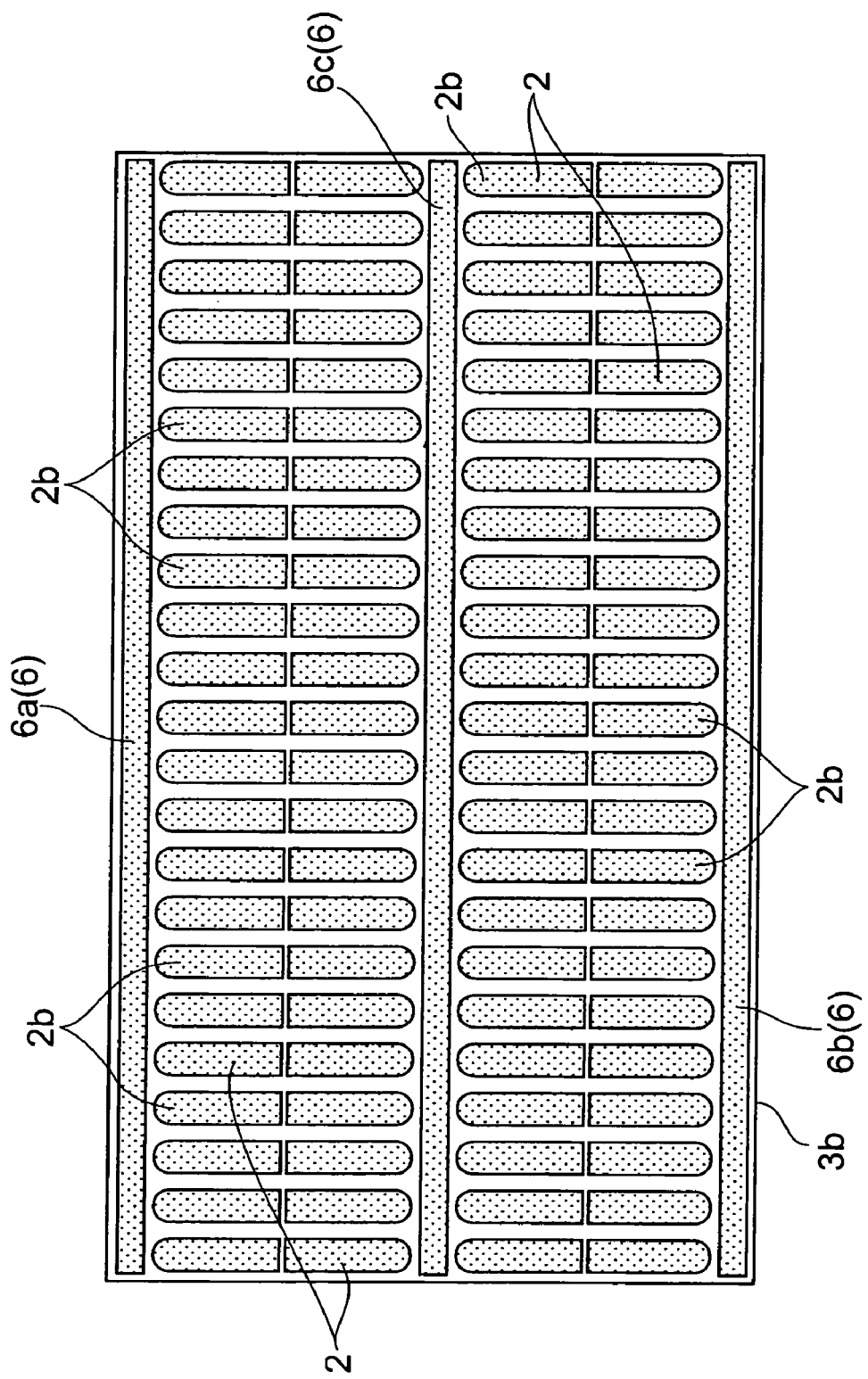
FIG. 3 is a plan view of the tenth piezoelectric layer in the stack-type piezoelectric device shown in FIG. 1.

Just as in the second, fourth, sixth, and eighth piezoelectric layers 3a described above, the individual electrodes 2 and relay common electrodes 6 are also formed on the upper surface of the piezoelectric layer 3b located as the tenth layer. The tenth piezoelectric layer 3b, however, is different from the aforementioned piezoelectric layers 3a in that the through holes 8, 13 are not formed, as shown in FIG. 3.

Figure 4:
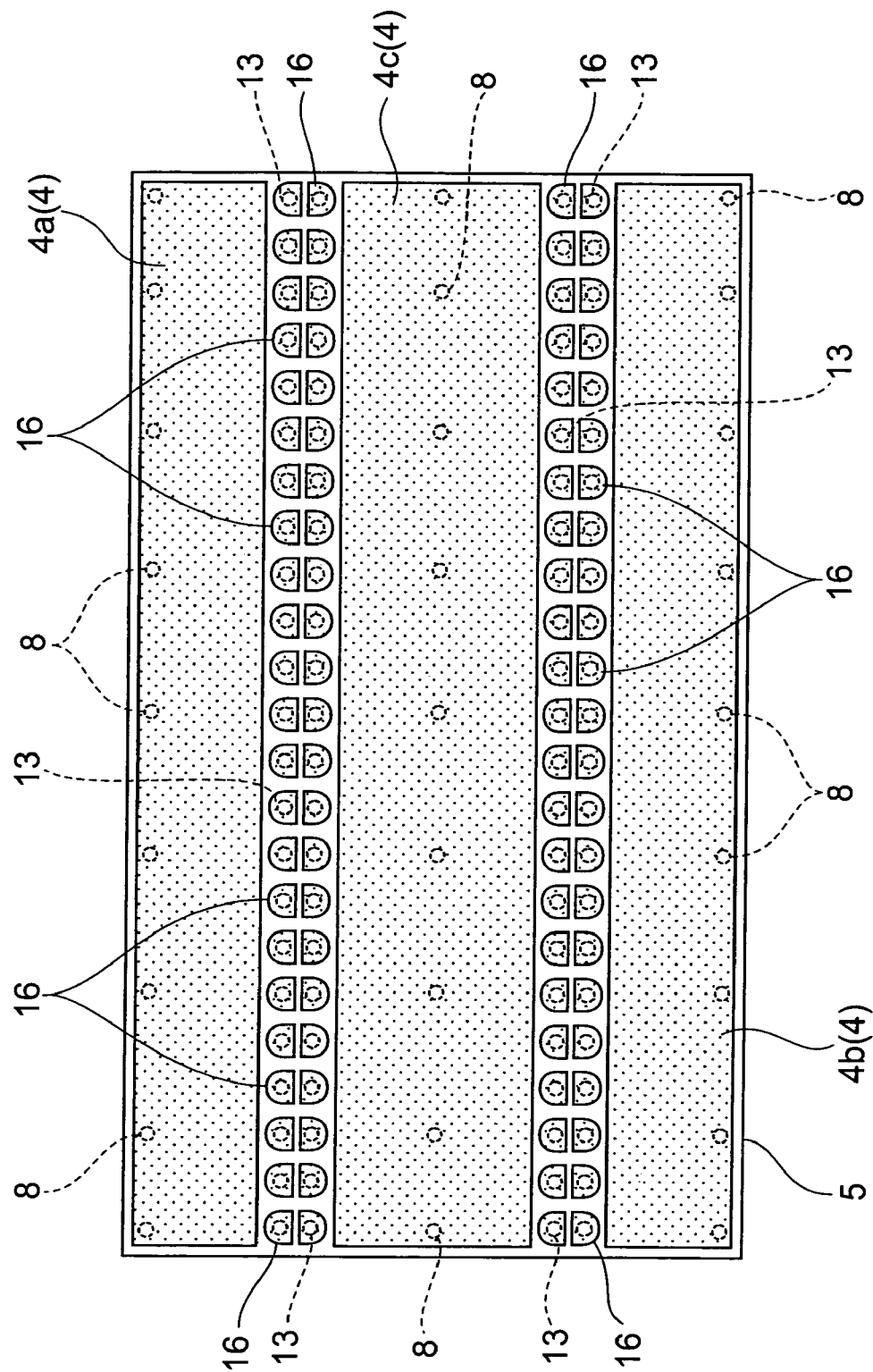
FIG. 4 is a plan view of the third, fifth, seventh, and ninth piezoelectric layers in the stack-type piezoelectric device shown in FIG. 1.

As shown in FIG. 4, relay individual electrodes 16 are formed so as to face the respective connection ends 2a of the piezoelectric layers 3a in the stack direction of the stack-type piezoelectric device 1 (in other words, "thickness direction of stack-type piezoelectric device 1," i.e., "thickness direction of piezoelectric layers 3, 5"), on the upper surfaces of the third, fifth, seventh, and ninth piezoelectric layers 5 as counted from the uppermost piezoelectric layer 7. Each relay individual electrode 16 is connected to an electroconductive member in a through hole 13 formed immediately below the relay individual electrode in the piezoelectric layer 5.

A rectangular common electrode 4a is formed outside the relay individual electrodes 16 in the first row on the upper surface of the piezoelectric layer 5 and, similarly, a rectangular common electrode 4b is also formed outside the relay individual electrodes 16 in the fourth row on the upper surface of the piezoelectric layer 5. Furthermore, a rectangular common electrode 4c is formed between the relay individual electrodes 16 in the second row and the relay individual electrodes 16 in the third row on the upper surface of the piezoelectric layer 5.

Each common electrode 4 overlaps with a portion of each individual electrode 2 except for its connection end 2a. This allows the whole of the portions facing the portions of the individual electrodes 2 except for the connection ends 2a thereof in the piezoelectric layers 3, 5 to be effectively used as active parts contributing to vibration. Each common electrode 4 is connected to electroconductive members in a plurality of through holes 8 formed in the piezoelectric layer 5 and along the extending direction of the relay common electrodes 6, so as to face the relay common electrode 6 of the piezoelectric layer 3 in the stack direction.

In the piezoelectric layer 5 described above, the end on the common electrode 4a side, of each relay individual electrode 16 in the first row adjacent to the common electrode 4a has a semicircular contour and, similarly, the end on the common electrode 4b side, of each relay individual electrode 16 in the fourth row adjacent to the common electrode 4b also has a semicircular contour. Furthermore, the end on the common electrode 4c side, of each relay individual electrode 16 in the second row and in the third row adjacent to the common electrode 4c also has a semicircular contour.

Figure 5:
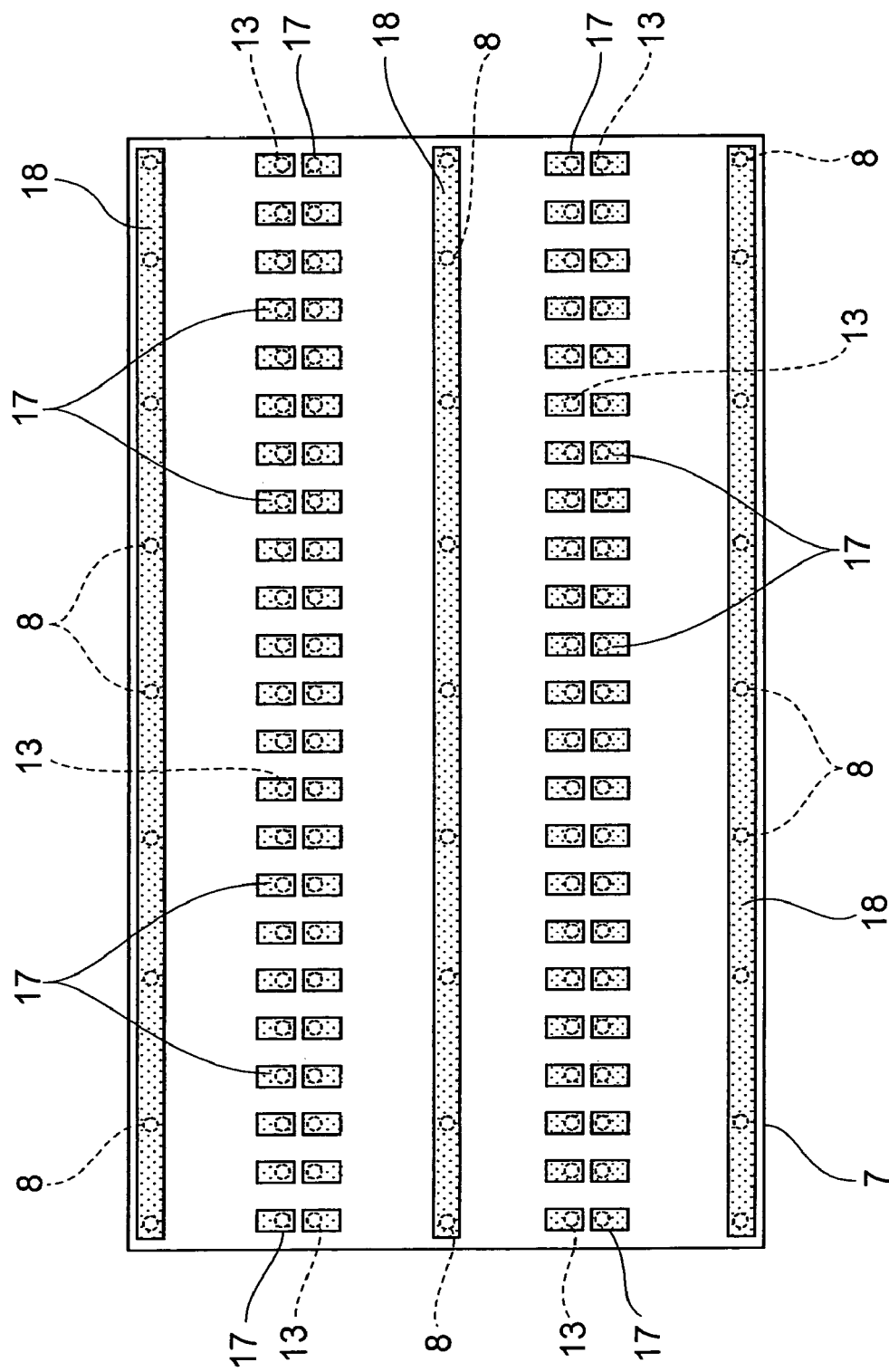
FIG. 5 is a plan view of the uppermost piezoelectric layer in the stack-type piezoelectric device shown in FIG. 1.

On the upper surface of the uppermost piezoelectric layer 7, as shown in FIG. 5, terminal electrodes 17 are formed so as to face the respective relay individual electrodes 16 of the piezoelectric layer 5 in the stack direction, and terminal electrodes 18 are formed to extend so as to face the relay common electrodes 6 of the piezoelectric layer 3 in the stack direction. Each terminal electrode 17 is connected to an electroconductive member in a through hole 13 formed immediately below the terminal electrode in the piezoelectric layer 7. On the other hand, each terminal electrode 18 is connected to electroconductive members in a plurality of through holes 8 formed in the piezoelectric layer 7 and along the extending direction of the relay common electrode 6, so as to face the relay common electrode 6 of the piezoelectric layer 3 in the stack direction. Lead wires for connection to a drive power supply are soldered to these terminal electrodes 17, 18.

Figure 6:
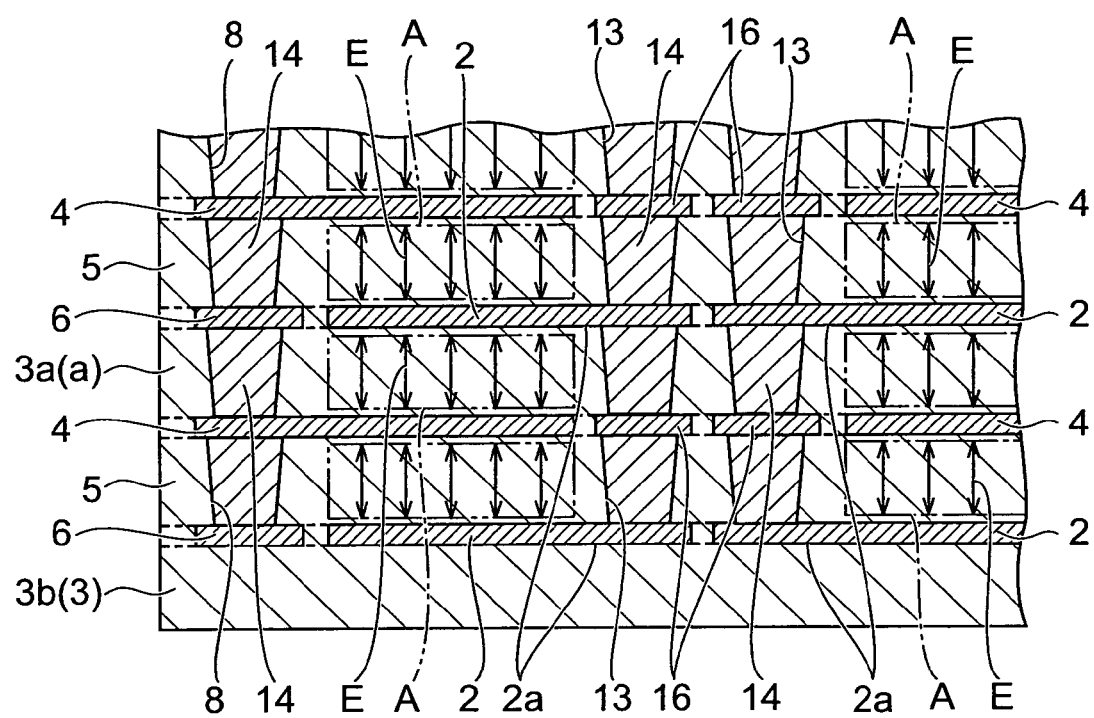
FIG. 6 is an enlarged sectional view in the direction perpendicular to the longitudinal direction of the stack-type piezoelectric device shown in FIG. 1.

By the stack of piezoelectric layers 3, 5, 7 with the electrode patterns formed therein as described above, five individual electrodes 2 are aligned in the stack direction through the intervention of the relay individual electrodes 16 with each terminal electrode 17 of the uppermost layer, and the electrodes 2, 16, and 17 thus aligned are electrically connected by the electroconductive members 14 in the through holes 13, as shown in FIG. 6. On the other hand, four common electrodes 4 are aligned in the stack direction through the intervention of the relay common electrodes 6 with each terminal electrode 18 of the uppermost layer, and the electrodes 4, 6, 18 thus aligned are electrically connected by the electroconductive members 14 in the through holes 8.

With this electrical connection in the stack-type piezoelectric device 1, when a voltage is applied between predetermined terminal electrode 17 and terminal electrode 18, the voltage is applied between the individual electrodes 2 aligned under the predetermined terminal electrode 17, and the common electrodes 4. This results in establishing electric fields E in the portions between the individual electrodes 2 and the common electrodes 4, as shown in FIG. 6, in the piezoelectric layers 3, 5, whereby these portions are displaced as active parts A. By selecting a terminal electrode 17 to which a voltage is to be applied, therefore, it is feasible to displace active parts A aligned under the selected terminal electrode 17, in the stack direction, among the active parts A corresponding to the respective individual electrodes 2 arranged in the matrix. The stack-type piezoelectric device 1 is applied to the drive source of various devices involving small displacement, such as control of a valve of a micropump.

In the stack-type piezoelectric device 1 constructed as described above, each piezoelectric layer 3 with the individual electrodes 2 formed therein also has the relay common electrodes 6 formed so as to be electrically connected to each of common electrodes 4, 4 adjacent in the stack direction. For this reason, for example, when the polarization process is carried out by applying a voltage between the individual electrodes 2 and the common electrodes 4 in production of the stack-type piezoelectric device 1, electric fields are generated not only in the thickness direction of the piezoelectric layer 3, but also between adjacent individual electrodes 2 and relay common electrode 6 (e.g., between each individual electrode 2 in the first row and the relay common electrode 6a) in the piezoelectric layer 3. At this time, since the end 2b on the relay common electrode 6 side, of each individual electrode 2 adjacent to the relay common electrode 6 has the semicircular contour, it is feasible to prevent cracks from being made in the portion between the adjacent individual electrodes 2 and relay common electrode 6 in the piezoelectric layer 3. This makes it feasible to achieve miniaturization of the stack-type piezoelectric device 1 or high integration of the individual electrodes 2, while maintaining the area of active parts A contributing to vibration in the piezoelectric layers 3, 5. In addition, it becomes feasible to narrow the space between the adjacent individual electrodes 2 and relay common electrode 6, for example, up to 50 µm.

Each piezoelectric layer 5 with the common electrodes 4 formed therein also has the relay individual electrodes 16 formed so as to be electrically connected to each of individual electrodes 2 adjacent in the stack direction. For this reason, in the piezoelectric layer 5, as in the case of the aforementioned piezoelectric layer 3, for example, when the polarization process is carried out by applying a voltage between the individual electrodes 2 and the common electrodes 4 in production of the stack-type piezoelectric device 1, electric fields are similarly generated not only in the thickness direction of the piezoelectric layer 5, but also between adjacent relay individual electrodes 16 and common electrode 4 (e.g., between each relay individual electrode 16 in the first row and the common electrode 4a). At this time, since the end on the common electrode 4 side, of each relay individual electrode 16 adjacent to the common electrode 4 has the semicircular contour, it is feasible to prevent cracks from being made in the portion between the adjacent relay individual electrodes 16 and common electrode 4 in the piezoelectric layer 5.

In the stack-type piezoelectric device 1, the voltage is almost simultaneously applied through the electroconductive members 14 in the plurality of through holes 8 formed in each piezoelectric layer 3, 5 and along the extending direction of the relay common electrodes 6, to the portions facing the individual electrodes 2 arrayed in each row direction, in each of common electrodes 4, 4 adjacent in the stack direction. Therefore, it is feasible to prevent the variations in the response time of the active part A corresponding to each individual electrode 2 from occurring depending upon the locations of the individual electrodes 2 arranged in the matrix, whereby the stack-type piezoelectric device 1 can be appropriately driven. Here the response time of the active part A refers to a time necessary for displacement of the active part A corresponding to a predetermined individual electrode 2 after application of the voltage between the predetermined individual electrode 2 and the common electrode 4.

Furthermore, in the stack-type piezoelectric device 1 the relay common electrodes 6 for electrical connection between adjacent common electrodes 4, 4 in the stack direction are formed so as to extend, and the relay common electrodes 6 and common electrodes 4 are electrically connected by the electroconductive members 14 in the plurality of through holes 8. For this reason, the electric resistance can be lowered on the common electrode 4 side upon application of the voltage between the individual electrodes 2 and common electrodes 4. Therefore, it is feasible to reduce a load on a drive circuit of the stack-type piezoelectric device 1 and to suppress generation of heat in an entire product including the stack-type piezoelectric device 1 and the drive circuit.

Next, a production procedure of the stack-type piezoelectric device 1 will be described. First, a substrate paste is prepared by mixing an organic binder, an organic solvent, etc. into a piezoelectric ceramic material consisting primarily of lead zirconate titanate or the like, and this substrate paste is used to form green sheets for the respective piezoelectric layers 3, 5, 7. An electroconductive paste is also prepared by mixing an organic binder, an organic solvent, etc. into a metal material consisting of silver and palladium in a predetermined proportion.

Subsequently, laser light is applied to predetermined positions of the green sheets for the respective piezoelectric layers 3, 5, 7 to form the through holes 8, 13. Then filling screen print with the electroconductive paste is carried out into the through holes 8, 13 to form the electroconductive members 14. Thereafter, screen print with the electroconductive paste is carried out onto the green sheets for the respective piezoelectric layers 3, 5 to form the electrodes 2, 4, 6, 16. Screen print with the electroconductive paste is also carried out onto the green sheet for the uppermost piezoelectric layer 7 to form ground electrodes of the terminal electrodes 17, 18.

Subsequently, the green sheets with the electrode patterns thereon are stacked in the aforementioned order and are pressed in the stack direction to form a green laminate. This green laminate is degreased and baked, and thereafter, baked electrodes of silver are placed on the respective ground electrodes on the calcined sheet for the piezoelectric layer 7 to form the terminal electrodes 17, 18. Thereafter, a polarization process is carried out to complete the stack-type piezoelectric device 1. The baking of silver in the formation of the terminal electrodes 17, 18 may be replaced by baking using gold, copper, or the like as a material, sputtering, vapor deposition, or electroless plating as a forming method, or the like.

The present invention is not limited to the above embodiment. For example, the above embodiment was directed to the case where the end 2b on the relay common electrode 6 side, of each individual electrode 2 adjacent to the relay common electrode 6 had the semicircular contour in the piezoelectric layers 3, but the end 2b of each individual electrode 2 may have any convexly curved contour on the relay common electrode 6 side. In this case, it is also feasible to prevent cracks from being made in the portion between adjacent individual electrodes 2 and relay common electrode 6 in the piezoelectric layers 3. Similarly, the end on the common electrode 4 side, of each relay individual electrode 16 adjacent to the common electrode 4 in the piezoelectric layers 5 is not limited to the semicircular contour, either, and may have any convexly curved contour on the common electrode 4 side.

As shown in FIG. 7, the corners 21 of the end 2b on the relay common electrode 6 side, of each individual electrode 2 adjacent to the relay common electrode 6 in the piezoelectric layers 3 may be roundly chamfered (i.e., they may be chamfered so as to be rounded) (FIG. 7(a)), or linearly chamfered (FIG. 7(b)). In these cases, it is also feasible to prevent cracks from being made in the portion between adjacent individual electrodes 2 and relay common electrode 6 in the piezoelectric layers 3.

Likewise, as shown in FIG. 8, the corners 22 of the end on the common electrode 4 side, of each relay individual electrode 16 adjacent to the common electrode 4 in the piezoelectric layers 5 may also be roundly chamfered (FIG. 8(a)), or linearly chamfered (FIG. 8(b)). In these cases, it is also feasible to prevent cracks from being made in the portion between adjacent relay individual electrodes 16 and common electrode 4 in the piezoelectric layers 5.

The present invention prevents cracks from being made in the portion between adjacent individual electrodes and relay common electrode in the piezoelectric layers with the individual electrodes formed therein, because of the polarization process or the like in production of the stack-type piezoelectric device.

What is claimed is:

1. A stack-type piezoelectric device comprising an alternate stack of first piezoelectric layers and second piezoelectric layers,
    wherein a plurality of individual electrodes electrically independent of each other are formed in each of the first piezoelectric layers,
    wherein a common electrode adapted for application of a voltage between the common electrode and the individual electrodes is formed in each of the second piezoelectric layers,
    wherein each of said first piezoelectric layers comprises a relay common electrode formed so as to be electrically connected to each of the common electrodes adjacent in a stack direction, by an electroconductive member in a through hole formed in the first piezoelectric layer and by an electroconductive member in a through hole formed in the second piezoelectric layer, and
    wherein an end on the relay common electrode side, of each individual electrode adjacent to the relay common electrode has a convexly curved contour.

2. The stack-type piezoelectric device according to claim 1, wherein each of the second piezoelectric layers comprises a relay individual electrode formed so as to be electrically connected to each of the individual electrodes adjacent in the stack direction, by an electroconductive member in a through hole formed in the first piezoelectric layer and by an electroconductive member in a through hole formed in the second piezoelectric layer, and
    wherein an end on the common electrode side, of each relay individual electrode adjacent to the common electrode has a convexly curved contour.

3. The stack-type piezoelectric device according to claim 1, wherein each of the second piezoelectric layers comprises a relay individual electrode formed so as to be electrically connected to each of the individual electrodes adjacent in the stack direction, by an electroconductive member in a through hole formed in the first piezoelectric layer and by an electroconductive member in a through hole formed in the second piezoelectric layer, and
    wherein corners in an end on the common electrode side, of each relay individual electrode adjacent to the common electrode are chamfered.

4. A stack-type piezoelectric device comprising an alternate stack of first piezoelectric layers and second piezoelectric layers,
    wherein a plurality of individual electrodes electrically independent of each other are formed in each of the first piezoelectric layers,
    wherein a common electrode adapted for application of a voltage between the common electrode and the individual electrodes is formed in each of the second piezoelectric layers,
    wherein each of said first piezoelectric layers comprises a relay common electrode formed so as to be electrically connected to each of the common electrodes adjacent in a stack direction, by an electroconductive member in a through hole formed in the first piezoelectric layer and by an electroconductive member in a through hole formed in the second piezoelectric layer, and
    wherein corners in an end on the relay common electrode side, of each individual electrode adjacent to the relay common electrode are chamfered.

5. The stack-type piezoelectric device according to claim 4, wherein each of the second piezoelectric layers comprises a relay individual electrode formed so as to be electrically connected to each of the individual electrodes adjacent in the stack direction, by an electroconductive member in a through hole formed in the first piezoelectric layer and by an electroconductive member in a through hole formed in the second piezoelectric layer, and
    wherein an end on the common electrode side, of each relay individual electrode adjacent to the common electrode has a convexly curved contour.

6. The stack-type piezoelectric device according to claim 4, wherein each of the second piezoelectric layers comprises a relay individual electrode formed so as to be electrically connected to each of the individual electrodes adjacent in the stack direction, by an electroconductive member in a through hole formed in the first piezoelectric layer and by an electroconductive member in a through hole formed in the second piezoelectric layer, and
    wherein corners in an end on the common electrode side, of each relay individual electrode adjacent to the common electrode are chamfered.

* * * * *